(12) United States Patent
Jain et al.

(10) Patent No.: US 11,695,064 B2
(45) Date of Patent: Jul. 4, 2023

(54) BIPOLAR JUNCTION TRANSISTORS WITH A WRAPAROUND BASE LAYER

(71) Applicant: GLOBALFOUNDRIES U.S. Inc., Santa Clara, CA (US)

(72) Inventors: Vibhor Jain, Essex Junction, VT (US); Judson R. Holt, Ballston Lake, NY (US); Tayel Nesheiwat, Poughkeepsie, NY (US); John J. Pekarik, Underhill, VT (US); Christopher Durcan, Albany, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 200 days.

(21) Appl. No.: 17/176,251

(22) Filed: Feb. 16, 2021

(65) Prior Publication Data
US 2022/0262930 A1  Aug. 18, 2022

(51) Int. Cl.
  *H01L 29/732* (2006.01)
  *H01L 29/66* (2006.01)
  *H01L 29/08* (2006.01)
  *H01L 29/06* (2006.01)

(52) U.S. Cl.
  CPC ........ *H01L 29/732* (2013.01); *H01L 29/0649* (2013.01); *H01L 29/0804* (2013.01); *H01L 29/66272* (2013.01)

(58) Field of Classification Search
  CPC ............. H01L 29/732; H01L 29/0649; H01L 29/66272; H01L 29/66242; H01L 29/0821; H01L 29/7371; H01L 29/737; H01L 21/8248–8249; H01L 27/0259–0262; H01L 27/0647–067; H01L 27/0711–0722; H01L 29/0804–0826; H01L 29/1004–1008; H01L 29/41708; H01L 29/42304; H01L 29/66234–66348
  See application file for complete search history.

(56) References Cited

U.S. PATENT DOCUMENTS

| | | | |
|---|---|---|---|
| 6,531,720 | B2 | 3/2003 | Freeman et al. |
| 6,982,442 | B2 | 1/2006 | Chan et al. |
| 7,425,754 | B2 | 9/2008 | Akatsu et al. |
| (Continued) | | | |

OTHER PUBLICATIONS

Qizhi Liu et al., "Self-Aligned Base and Emitter for a Bipolar Junction Transistor", filed Aug. 26, 2019 as U.S. Appl. No. 16/551,061.
(Continued)

*Primary Examiner* — Shahed Ahmed
(74) *Attorney, Agent, or Firm* — Thompson Hine LLP; Anthony Canale

(57) ABSTRACT

Device structures and fabrication methods for a bipolar junction transistor. The device structure includes a substrate and a trench isolation region in the substrate. The trench isolation region surrounds an active region of the substrate. The device structure further includes a collector in the active region of the substrate, a base layer having a first section positioned on the active region and a second section oriented at an angle relative to the first section, an emitter positioned on the first section of the base layer, and an extrinsic base layer positioned over the trench isolation region and adjacent to the emitter. The second section of the base layer is laterally positioned between the extrinsic base layer and the emitter.

20 Claims, 6 Drawing Sheets

(56) References Cited

U.S. PATENT DOCUMENTS

| | | |
|---|---|---|
| 7,521,772 B2 | 4/2009 | Adam et al. |
| 2005/0001238 A1* | 1/2005 | Oue ................... H01L 29/7322 |
| | | 257/E29.184 |
| 2014/0021587 A1* | 1/2014 | Harame ............... H01L 29/732 |
| | | 438/364 |
| 2018/0226347 A1* | 8/2018 | Stamper ............. H01L 29/0649 |
| 2019/0237568 A1* | 8/2019 | Mishra ................ H01L 29/749 |
| 2020/0295165 A1* | 9/2020 | Jain ...................... H01L 29/165 |

OTHER PUBLICATIONS

V. T. Vu, D. Celi, T. Zimmer, S. Fregonese and P. Chevalier, "Advanced Si/SiGe HBT architecture for 28-nm FD-SOI BiCMOS," 2016 IEEE Bipolar/BiCMOS Circuits and Technology Meeting (BCTM), New Brunswick, NJ, USA, 2016, pp. 64-67.

P. Chevalier et al., "SiGe BiCMOS Current Status and Future Trends in Europe," 2018 IEEE BiCMOS and Compound Semiconductor Integrated Circuits and Technology Symposium (BCICTS), San Diego, CA, 2018, pp. 64-71.

* cited by examiner

BIPOLAR JUNCTION TRANSISTORS WITH A WRAPAROUND BASE LAYER

STATEMENT REGARDING FEDERALLY SPONSORED RESEARCH OR DEVELOPMENT

This invention was made with government support under HR0011-20-3-0002 awarded by the Defense Advanced Research Projects Agency. The government has certain rights in the invention.

BACKGROUND

The invention relates generally to semiconductor device and integrated circuit fabrication and, in particular, to device structures and fabrication methods for a bipolar junction transistor.

A bipolar junction transistor is a three-terminal electronic device that includes an emitter, a collector, and an intrinsic base defining respective junctions with the emitter and collector. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials have different energy bandgaps, which creates heterojunctions. For example, the collector and emitter of a heterojunction bipolar transistor may be constituted by silicon, and the intrinsic base of a heterojunction bipolar transistor may be constituted by silicon-germanium, which is characterized by a narrower band gap than silicon.

Although existing structures have proven suitable for their intended purpose, improved structures and fabrication methods for a bipolar junction transistor are needed.

SUMMARY

In an embodiment of the invention, a device structure for a bipolar junction transistor is provided. The device structure includes a substrate and a trench isolation region in the substrate. The trench isolation region surrounds an active region of the substrate. The device structure further includes a collector in the active region of the substrate, a base layer having a first section positioned on the active region and a second section oriented at an angle relative to the first section, an emitter positioned on the first section of the base layer, and an extrinsic base layer positioned over the trench isolation region and adjacent to the emitter. The second section of the base layer is laterally positioned between the extrinsic base layer and the emitter.

In an embodiment of the invention, a method is provided of forming a device structure for a bipolar junction transistor. The method includes forming a trench isolation region surrounding an active region of a substrate. The method further includes forming a collector in the active region of the substrate, forming an extrinsic base layer positioned over the trench isolation region, forming a base layer including a first section positioned on the active region and a second section oriented at an angle relative to the first section, and forming an emitter positioned on the first section of the base layer. The extrinsic base layer is positioned adjacent to the emitter, and the second section of the base layer is laterally positioned between the extrinsic base layer and the emitter.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
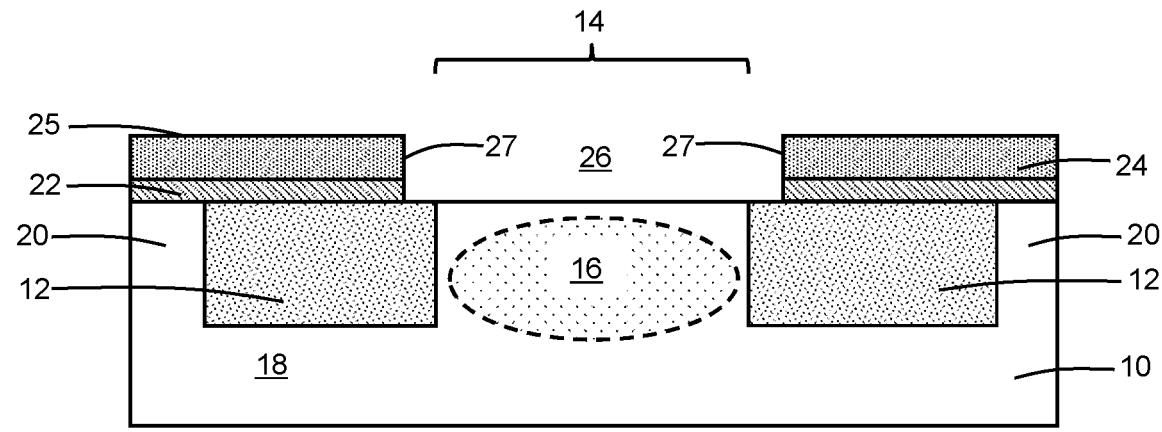
FIGS. 1-5 are cross-sectional views of a device structure at successive fabrication stages of a processing method in accordance with embodiments of the invention.

With reference to FIG. 1 and in accordance with embodiments of the invention, a substrate 10 is comprised of a single-crystal semiconductor material suitable for the fabrication of the device structures of an integrated circuit. The semiconductor material constituting the substrate 10 may include an epitaxial layer at its top surface, and the epitaxial layer may be doped with an electrically-active dopant to alter its electrical conductivity. For example, an epitaxial layer of single-crystal silicon may be epitaxially grown on the substrate 10 and doped with an n-type dopant (e.g., phosphorus or arsenic) to provide n-type conductivity.

A trench isolation region 12 is formed in the substrate 10. The trench isolation region 12 surrounds an active region 14 that is comprised of a portion of the semiconductor material of the substrate 10. The trench isolation region 12 may be formed by a shallow trench isolation technique that patterns trenches in the substrate 10 with lithography and etching processes, deposits a dielectric material to overfill the trenches, and planarizes the dielectric material using chemical mechanical polishing and/or an etch back to remove excess dielectric material from the field. The dielectric material may be comprised of an electrical insulator, such as silicon dioxide, deposited by chemical vapor deposition.

A collector 16 is positioned arranged in the active region 14 and may constitute either all or a portion of the active region 14. The electrical conductivity of the collector 16 may be elevated relative to the substrate 10 by, for example, selectively implanting a dopant, such as an n-type dopant, into a central region of the active region 14. A subcollector 18 extends laterally in the substrate 10 beneath the trench isolation region 12 in order to couple the collector 16 with a collector contact region 20, which is arranged outside of the trench isolation region 12. The subcollector 18 may be formed beneath the top surface of the substrate 10 by introducing an electrically-active dopant, such as an n-type dopant (e.g., phosphorus or arsenic) to produce n-type conductivity. In one embodiment, the subcollector 18 may be formed in the substrate 10 by a masked high-current ion implantation followed by a high-temperature thermal anneal.

Figure 5:
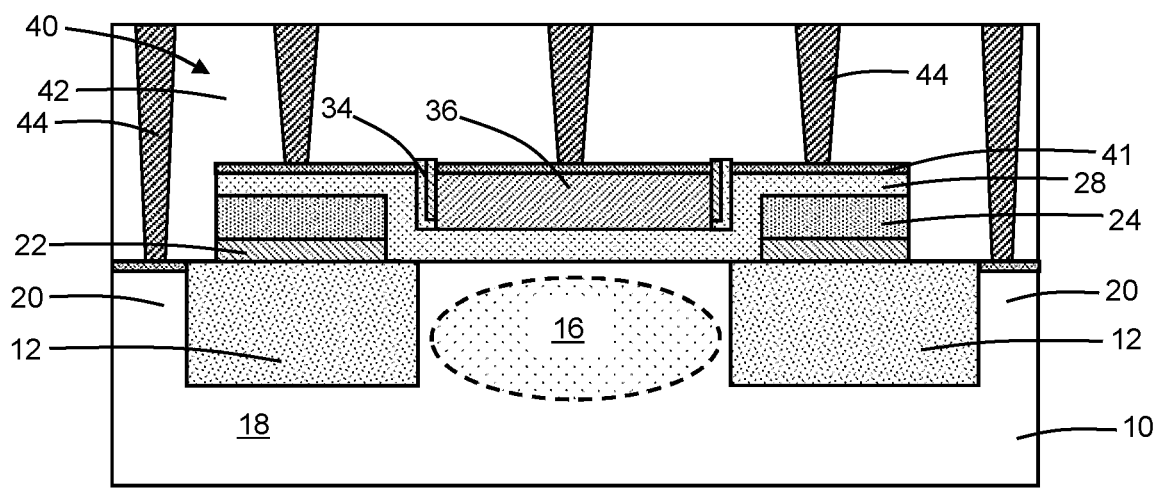

A dielectric layer 22 is formed that covers the trench isolation region 12 and the substrate 10. The dielectric layer 22 may be comprised of an electrical insulator, such as silicon nitride. A semiconductor layer 24 is formed that covers the dielectric layer 22. The semiconductor layer 24 may be comprised of a semiconductor material, such as polycrystalline silicon (i.e. polysilicon), polycrystalline silicon-germanium, or a combination of these materials, that is heavily doped with an electrically-active dopant, such as a p-type dopant (e.g., boron) to produce p-type conductivity. The semiconductor layer 24 eventually provides an extrinsic base layer in the completed device structure 40 (FIG. 5).

An opening 26 is patterned by lithography and etching processes that extends through the dielectric layer 22 and semiconductor layer 24 to the substrate 10 in the active region 14.

The opening 26 defines an emitter window that may overlap at its periphery with a portion of the trench isolation region 12. More specifically, the opening 26 has sidewalls 27 that penetrate through the dielectric layer 22 and the semiconductor layer 24 from a top surface 25 of the semiconductor layer 24 to the trench isolation region 12. The dielectric layer 22 and semiconductor layer 24 have respective side surfaces that are coextensive with the sidewalls 27 of the opening 26.

Figure 2:
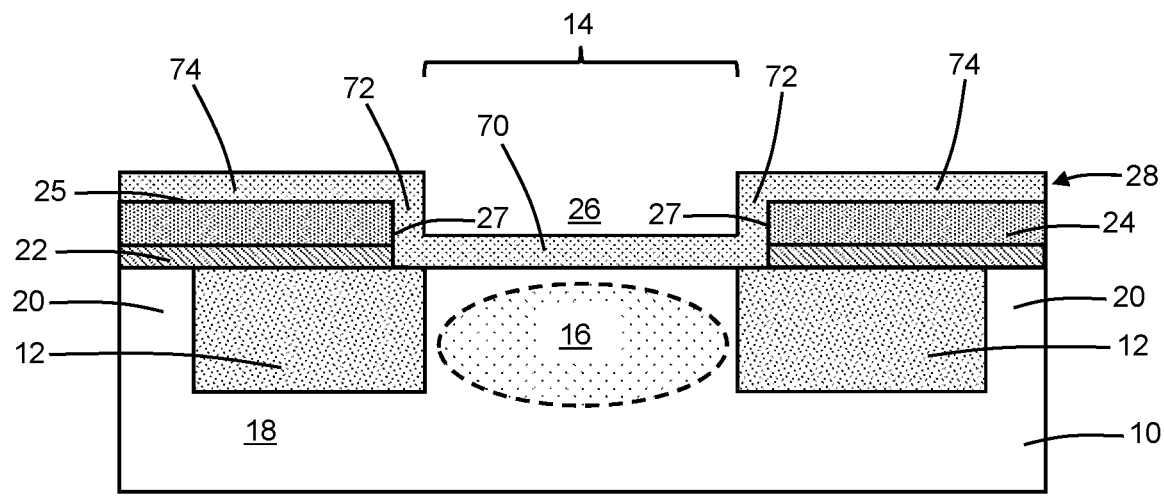

With reference to FIG. 2 in which like reference numerals refer to like features in FIG. 1 and at a subsequent fabrication stage of the processing method, a base layer 28 is formed as a continuous film over the semiconductor layer 24 and inside the opening 26. The base layer 28 follows the contour provided by the opening 26 and curves about the sidewalls 27 of the opening 26 in a wraparound manner. In particular, the base layer 28 wraps about the semiconductor layer 24. A section 70 of the base layer 28 is positioned inside the opening 26 on the substrate 10 in the active region 14 and the exposed portion of the trench isolation region 12 surrounding the active region 14. The opening 26 extends through the dielectric layer 22 and semiconductor layer 24 to the section 70 of the base layer 28.

Sections 72 of the base layer 28 are positioned inside the opening 26 laterally adjacent to the sidewalls 27 and directly contact the side surface of the semiconductor layer 24 at the sidewalls 27. The sections 72 of the base layer 28 are oriented at an angle relative to the section 70 of the base layer 28 and extend away from the active region 14 of the substrate 10. In an embodiment, the sections 72 of the base layer 28 may be transversely oriented relative to the section 70 of the base layer 28.

Sections 74 of the base layer 28 are positioned outside of the opening 26 and adjacent to and over a top surface 25 of the semiconductor layer 24. In an embodiment, the sections 72 of the base layer 28 may directly contact the top surface 25 of the semiconductor layer 24. The sections 72 of the base layer 28 may physically connect the section 70 of the base layer 28 to the sections 74 of the base layer 28. The semiconductor layer 24 is positioned in a vertical direction between the sections 74 of the base layer 28 and the trench isolation region 12.

The base layer 28 may be comprised of a semiconductor material, such as silicon-germanium (SiGe) including silicon and germanium combined in an alloy with the silicon content ranging from 95 atomic percent to 50 atomic percent and the germanium content ranging from 5 atomic percent to 50 atomic percent. The germanium content of the base layer 28 may be uniform, or may be graded and/or stepped across its thickness with portions that lack germanium. The base layer 28 may be doped with a concentration of an electrically-active dopant, such as a p-type dopant (e.g., boron) to provide p-type conductivity. The base layer 28 may be formed using an epitaxial growth process and may provide a conformal coating. The base layer 28 may include single-crystal semiconductor material epitaxially grown on the active region 14, and polycrystalline semiconductor material that forms on the semiconductor layer 24. In an embodiment, the different sections 70, 72, 74 of the base layer 28 may have equal thicknesses. In an embodiment, the different sections 70, 72, 74 of the base layer 28 may have substantially equal thicknesses.

Figure 3:
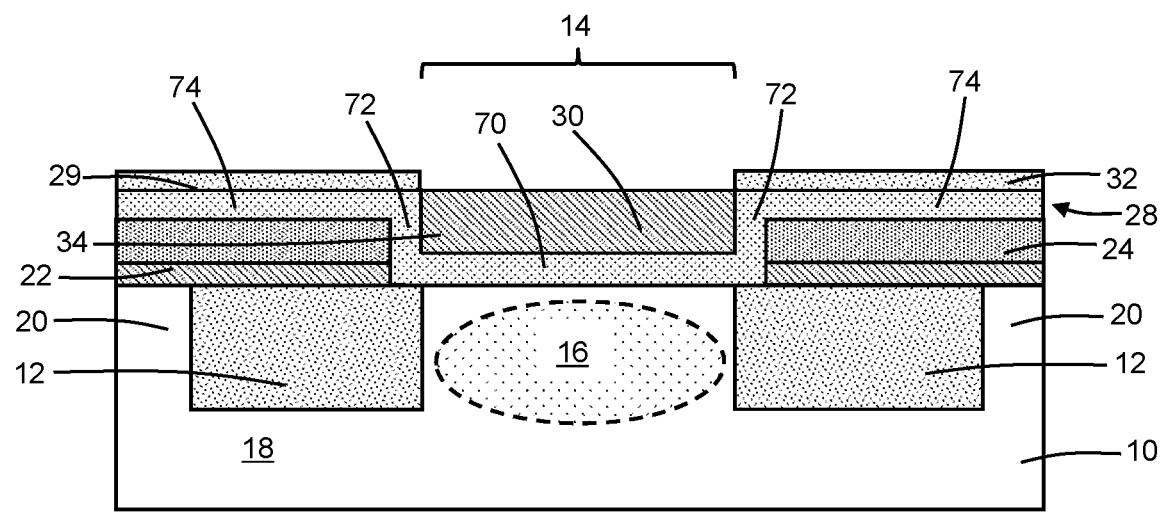

With reference to FIG. 3 in which like reference numerals refer to like features in FIG. 2 and at a subsequent fabrication stage of the processing method, a dielectric layer 30 is formed in the space inside the opening 26 on the section 70 of the base layer 28 inside the opening 26 and between the sections 72 of the base layer 28 inside the opening 26. The dielectric layer 30 may be comprised of a dielectric material, such as silicon nitride. The dielectric layer 30 may be formed by a depositing a blanket layer of dielectric material and polishing and/or etching back the blanket layer. The thickness of the dielectric layer 30 is sufficient to cover the sections 72 of the base layer 28. A top surface 29 of the base layer 28 is exposed adjacent to the opening 26 after the formation of the dielectric layer 30.

A dielectric layer 32 may be formed on the exposed top surface 29 of the base layer 28. In an embodiment, the dielectric layer 32 may be comprised of silicon dioxide formed by a thermal oxidation process. The dielectric layer 30 is comprised of a material that is removable selective to the material of the dielectric layer 32.

Figure 4:
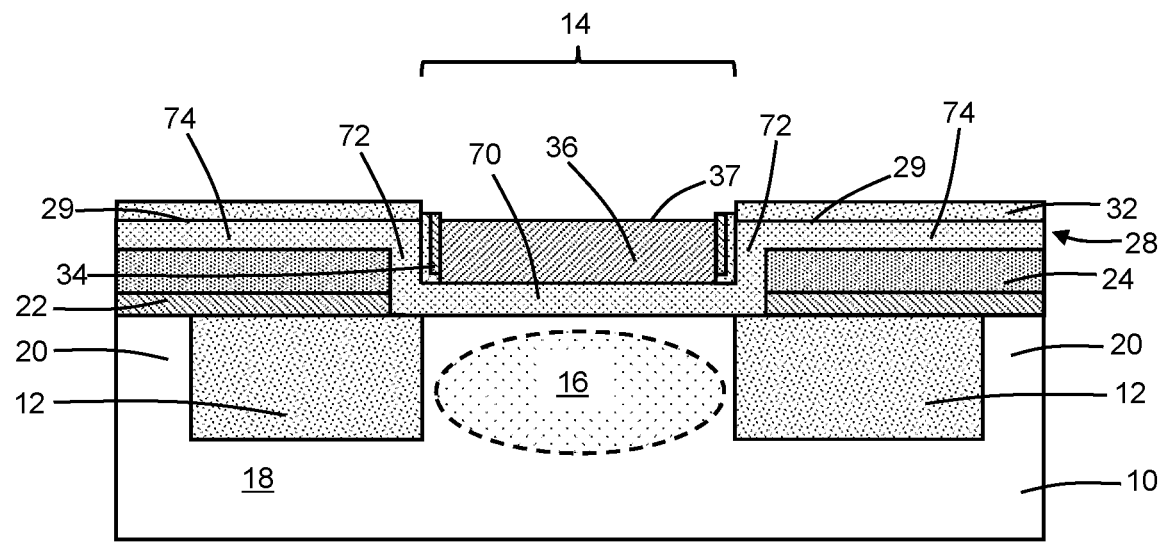

With reference to FIG. 4 in which like reference numerals refer to like features in FIG. 3 and at a subsequent fabrication stage of the processing method, the dielectric layer 30 is removed by an etching process selective to the dielectric layer 32. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. The removal of the dielectric layer 30 reveals the sections 70, 72 of the base layer 28.

Spacers 34 are formed inside the opening 26 on the section 70 of the base layer 28 and adjacent to the sections 72 of the base layer 28 at the sidewalls 27 of the opening 26. The spacers 34 cover the sections 72 of the base layer 28 and portions of the section 70 of the base layer 28. The spacers 34 may be bilayer spacers comprised of multiple dielectric materials, such as silicon dioxide and silicon nitride, that are deposited as conformal layers by atomic layer deposition or chemical vapor deposition and then etched with one or more anisotropic etching processes, such as reactive ion etching processes. The sections 72 of the base layer 28 function to self-align the spacers 34 with the opening 26 during the etching process.

An emitter 36 is formed inside the opening 26 on the section 70 of the base layer 28 and laterally between the sidewalls 27 of the opening 26. The emitter 36 may be comprised of single-crystal semiconductor material, such as single-crystal silicon, grown by an epitaxial growth process. In an embodiment, the emitter 36 may be formed by a selective epitaxial growth (SEG) process in which semiconductor material nucleates for epitaxial growth from the exposed surface of the substrate 10, but does not nucleate for epitaxial growth from insulator surfaces, such as the dielectric layer 32 and spacers 34. The emitter 36 may be comprised of a single-crystal semiconductor material, such as single-crystal silicon, and may be in situ doped during epitaxial growth with an electrically-active dopant, such as an n-type dopant (e.g., phosphorus or arsenic).

In an embodiment, the emitter 36 has a top surface 37 that may be coplanar with a top surface 29 of the sections 74 of the base layer 28. In an embodiment, the emitter 36 has a top surface 37 that may be substantially coplanar with a top surface 29 of the sections 74 of the base layer 28. The spacers 34 are laterally positioned between the emitter 36 and the sections 72 of the base layer 28, which establishes a boundary for the emitter-base junction.

With reference to FIG. 5 in which like reference numerals refer to like features in FIG. 4 and at a subsequent fabrication stage of the processing method, a device structure 40 for a bipolar junction transistor is patterning by photolithography and etching processes. The patterning of the device structure 40 opens the collector contact region 20. The dielectric layer 32 may be removed from the sections 74 of the base layer 28 by an etching process. A silicide layer 41 is formed by a silicidation process on the collector contact region 20, semiconductor layer 24, and emitter 36.

The device structure 40 includes the collector 16, the emitter 36, and an intrinsic base provided by the section 70 of the base layer 28 that is arranged between the emitter 36 and collector 16. The spacers 34 separate the sections 72 of the base layer 28 from the emitter 36 and provide electrical isolation. A junction is located between the section 70 of the base layer 28 and the overlying emitter 36, and another junction is located between the section 70 of the base layer 28 and the underlying collector 16. The device structure 40 may be considered a heterojunction bipolar transistor if, for example, the base layer 28 is comprised of silicon-germanium. The device structure 40 can be divided into an intrinsic region that includes the junctions, and an extrinsic region that is peripherally arranged outside of the intrinsic region.

The semiconductor layer 24 provides an extrinsic base layer of the device structure 40. The semiconductor layer 24 is positioned over the trench isolation region 12 adjacent to the sections 72 of the base layer 28 at the sidewalls 27 of the opening 26. The spacers 34, which are laterally positioned between the sections 72 of the base layer 28 and the emitter 36, define a boundary for the emitter-base junction. The sections 72 of the base layer 28 are laterally positioned between the spacers 34 and the semiconductor layer 24 providing the extrinsic base layer.

Middle-of-line processing and back-end-of-line processing follow, which includes formation of contacts, vias, and wiring for an interconnect structure coupled with the device structure 40. The interconnect structure may include a dielectric layer 42 that is formed over the device structure 40. The dielectric layer 42 may be comprised of a dielectric material, such as silicon dioxide, deposited by chemical vapor deposition and planarized. Contacts 44, which are physically and electrically coupled to the silicide layer 41 on the collector contact region 20, base layer 28, and emitter 36, are formed by patterning contact openings formed in the dielectric layer 42 with a lithography and etching process, followed by filling the contact openings with a conductor, such as tungsten.

The device structure 40 has a self-aligned and planar construction that is achieved with a simplified process flow. The semiconductor layer 24 providing the extrinsic base layer is formed before the base layer 28 is formed and, as a result, the semiconductor layer 24 is positioned in a vertical direction between the trench isolation region 12 and the sections 74 of the base layer 28. The sections 72, 74 of the base layer 28 are wrapped around the semiconductor layer 24 providing the extrinsic base. Because of the formation order, the semiconductor layer 24 may be formed by a non-selective growth process. The spacers 34 defining the emitter-base junction at its peripheral edges are self-aligned during formation by the sections 72 of the base layer 28 at the peripheral edges of the opening 26 in which the emitter 36 is subsequently formed also in a fully self-aligned manner.

The device structure 40 may exhibit a reduced collector-base capacitance because, for example, pulldown of the trench isolation region 12 during device formation may be reduced or eliminated. The reduction in the collector-base capacitance (Ccb) may improve operational figures of merit, such as maximum frequency, transit frequency, and gain, for the device structure 40. The device structure 40 may exhibit a reduced base resistance (Rb) because of the highly-doped extrinsic base layer provided by the semiconductor layer 24 and the full self-alignment during the formation of the emitter 36 provided by the spacers 34. The collector 16 and the emitter 36 are scaled to have approximately equal sizes, which may contribute to reducing the base resistance and the collector-base capacitance.

Figure 6:
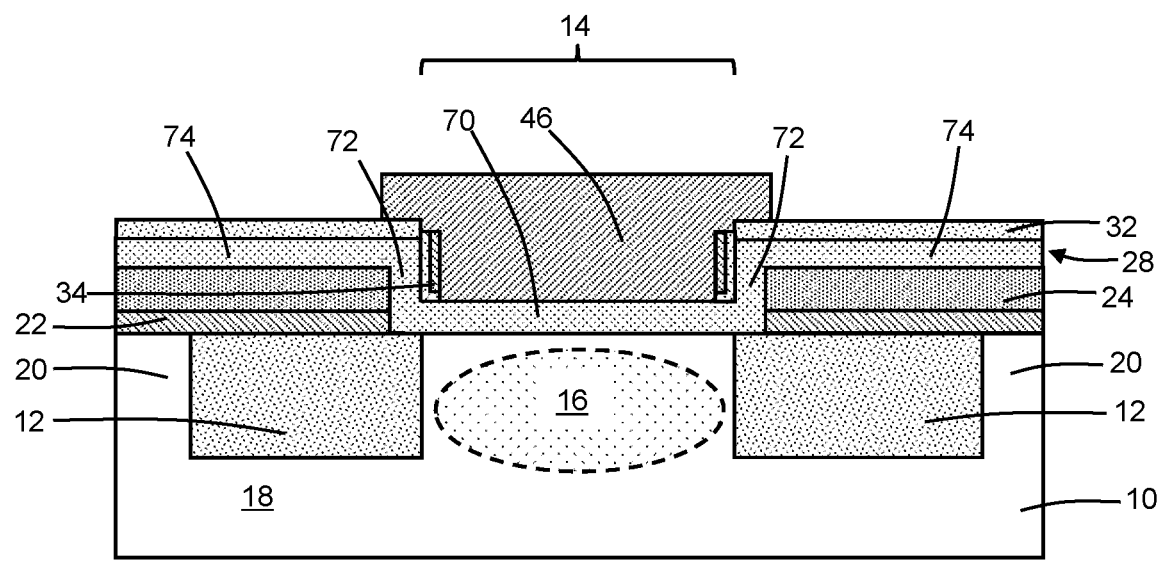
FIG. 6 is a cross-sectional view of a device structure in accordance with alternative embodiments of the invention.

With reference to FIG. 6 in which like reference numerals refer to like features in FIG. 5 and in accordance with alternative embodiments, an emitter 46 may be formed by depositing and patterning a layer of a conductor, such as doped polysilicon. Unlike the emitter 36 which it replaces in the device structure 40, the emitter 46 is formed in a manner that is not fully self-aligned due to its deposition and patterning. Processing continues to shape the device structure 40 and form the interconnect structure coupled to the device structure 40.

Figure 7:
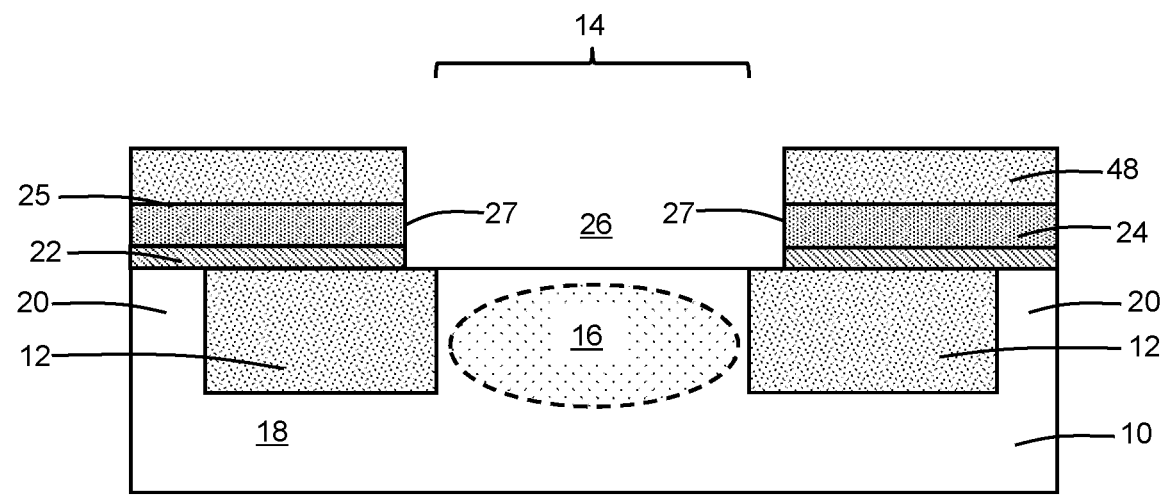
FIGS. 7-11 are cross-sectional views of a device structure at successive fabrication stages of a processing method in accordance with alternative embodiments of the invention.

With reference to FIG. 7 and in accordance with embodiments of the invention, a dielectric layer 48 may be formed that covers the top surface 25 of the semiconductor layer 24. The dielectric layer 48 may be comprised of an electrical insulator, such as silicon dioxide. The opening 26, when patterned, penetrates through the dielectric layer 48, as well as the dielectric layer 22 and semiconductor layer 24, to the substrate 10 in the active region 14.

Figure 8:
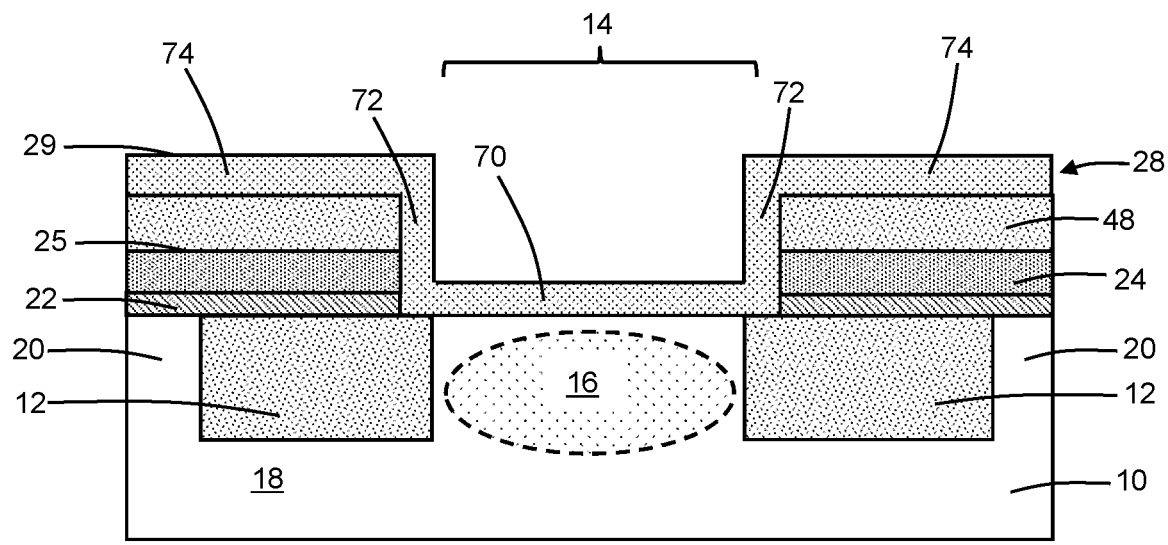

With reference to FIG. 8 in which like reference numerals refer to like features in FIG. 7 and at a subsequent fabrication stage of the processing method, the base layer 28 is formed as a continuous film over the dielectric layer 48 and inside the opening 26. The base layer 28 follows the contour provided by the opening 26 and curves about the sidewalls 27 of the opening 26 in a wraparound manner. The base layer 28 includes the section 70 formed on the substrate 10 in the active region 14 and the exposed portion of the trench isolation region 12 surrounding the active region 14, the sections 72 formed on the sidewalls 27 of the opening 26, and the sections 74 that are formed on the dielectric layer 48 instead of on the top surface 25 of the semiconductor layer 24.

Figure 9:
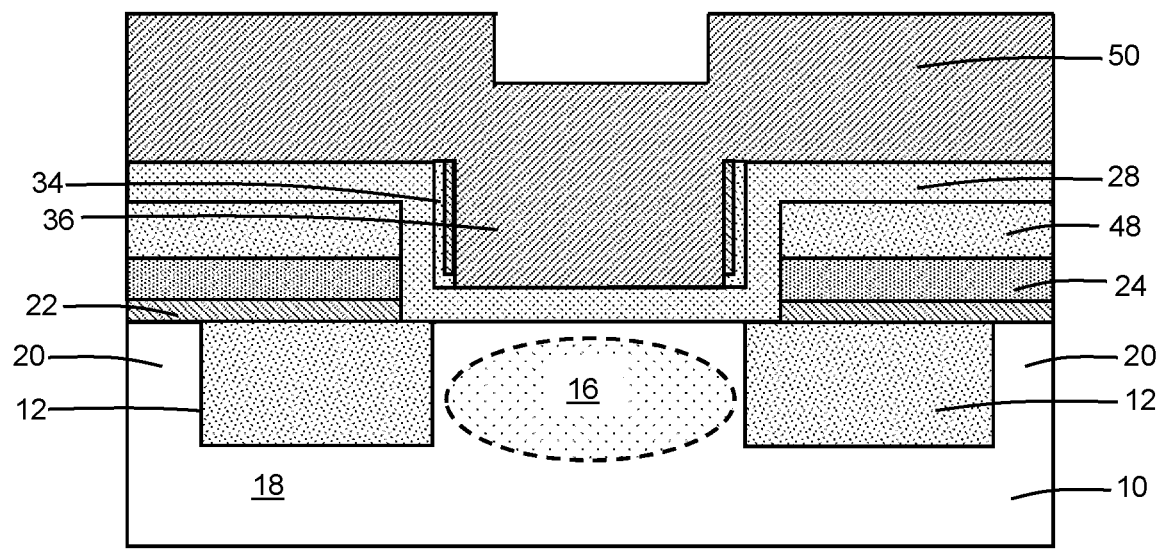

With reference to FIG. 9 in which like reference numerals refer to like features in FIG. 8 and at a subsequent fabrication stage of the processing method, the spacers 34 are formed inside the opening 26 as described in connection with FIG. 4. A layer 50 comprised of a conductor, such as doped polysilicon, is deposited that covers the dielectric layer 48 and includes a portion that fills the opening 26.

Figure 10:
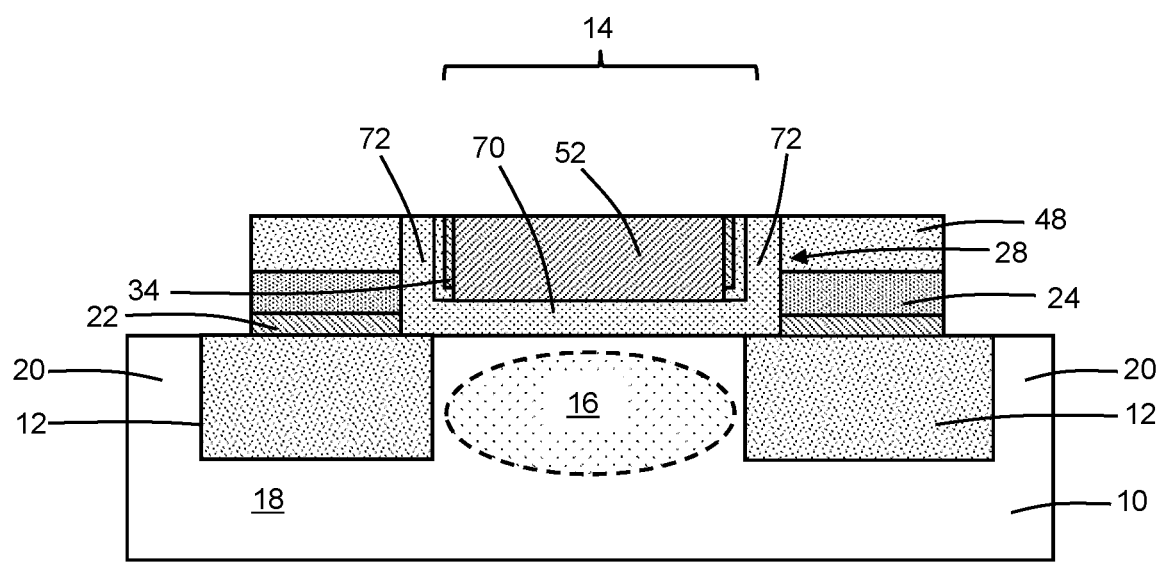

With reference to FIG. 10 in which like reference numerals refer to like features in FIG. 9 and at a subsequent fabrication stage of the processing method, the base layer 28, the spacers 34, and the layer 50 are planarized by a chemical-mechanical polishing process. The planarization defines an emitter 52 from the polished portion of the layer 50 positioned residing inside the opening 26. The sections 74 (FIG. 8) of the base layer 28 are fully removed from the dielectric layer 48, which leaves the sections 70, 72 of the base layer 28 intact inside the opening 26.

Figure 11:
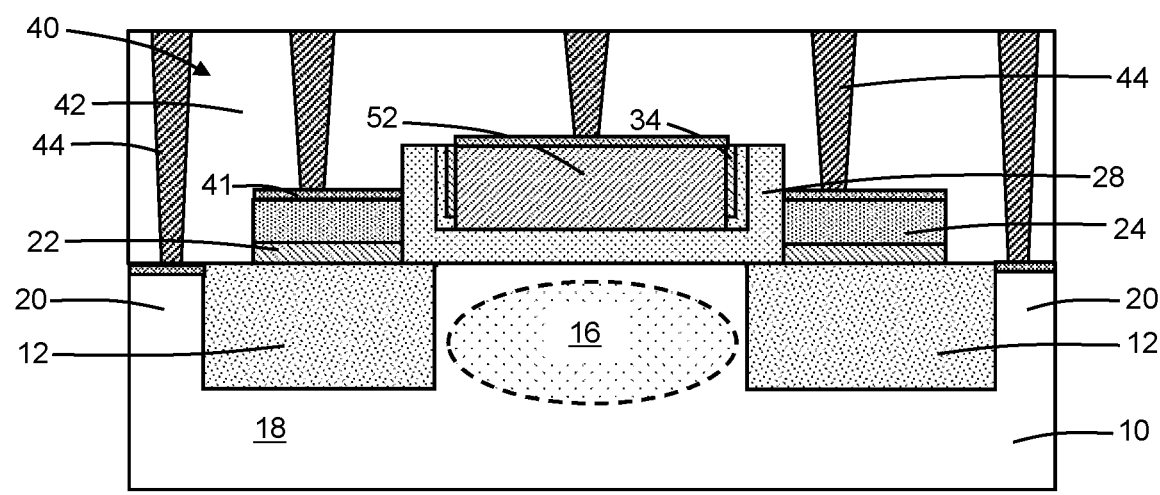

With reference to FIG. 11 in which like reference numerals refer to like features in FIG. 10 and at a subsequent fabrication stage of the processing method, the device structure 40 is patterned by lithography and etching processes to open the collector contact region 20, the dielectric layer 42 is formed over the device structure 40, and the contacts 44 are formed in the dielectric layer 42. The dielectric layer 48 may be removed, before the dielectric layer 42 is deposited, to expose the semiconductor layer 24. The silicide layer 41 may be formed before the dielectric layer 42 is deposited.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing de-vices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/− 10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features overlap if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
   a substrate;
   a trench isolation region in the substrate, the trench isolation region surrounding an active region of the substrate;
   a collector in the active region of the substrate;
   a base layer including a first section positioned on the active region and a second section oriented at an angle relative to the first section;
   an emitter positioned on the first section of the base layer; and
   an extrinsic base layer positioned over the trench isolation region and adjacent to the emitter,
   wherein the second section of the base layer is laterally positioned between the extrinsic base layer and the emitter, and the base layer includes a third section positioned adjacent to the emitter and over the extrinsic base layer.

2. The device structure of claim 1, wherein the third section of the base layer has a top surface, and the emitter has a top surface that is substantially coplanar with the top surface of the third section of the base layer.

3. The device structure of claim 1, wherein the second section of the base layer connects the first section of the base layer to the third section of the base layer.

4. The device structure of claim 1, further comprising:
   a dielectric spacer positioned laterally between the second section of the base layer and the emitter.

5. The device structure of claim 1, wherein the second section of the base layer is transversely oriented relative to the first section of the base layer.

6. The device structure of claim 1, wherein the first section and the second section of the base layer have substantially equal thicknesses.

7. A device structure for a bipolar junction transistor, the device structure comprising:
   a substrate;
   a trench isolation region in the substrate, the trench isolation region surrounding an active region of the substrate;
   a collector in the active region of the substrate;
   a base layer including a first section positioned on the active region and a second section oriented at an angle relative to the first section;
   an emitter positioned on the first section of the base layer; and
   an extrinsic base layer positioned over the trench isolation region and adjacent to the emitter, the extrinsic base layer including an opening that extends to the first section of the base layer,
   wherein the second section of the base layer is laterally positioned between the extrinsic base layer and the emitter.

8. The device structure of claim 7, wherein the first section and the second section of the base layer are positioned inside the opening.

9. The device structure of claim 7, wherein the emitter is positioned inside the opening.

10. The device structure of claim 9, further comprising:
    a first dielectric spacer positioned inside the opening laterally between the second section of the base layer and the emitter.

11. The device structure of claim 10, wherein the opening has a sidewall, and the first dielectric spacer is positioned inside the opening on the first section of the base layer and adjacent to the sidewall.

12. The device structure of claim 10, wherein the opening has a sidewall, the first dielectric spacer is positioned inside the opening adjacent to the sidewall, and the second section of the base layer is laterally positioned between the first dielectric spacer and the extrinsic base layer.

13. The device structure of claim 10, wherein the opening has a first sidewall and a second sidewall, the first dielectric spacer is positioned inside the opening adjacent to the first sidewall and laterally between the emitter and the second section of the base layer, and further comprising:
   a second dielectric spacer positioned inside the opening adjacent to the second sidewall,
   wherein the base layer includes a third section oriented at an angle relative to the first section, and the second dielectric spacer is laterally positioned between the emitter and the third section of the base layer.

14. The device structure of claim 13, wherein the second section and the third section of the base layer are transversely oriented relative to the first section of the base layer.

15. The device structure of claim 7, wherein the base layer includes a third section positioned adjacent to the emitter and over the extrinsic base layer.

16. A method of forming a device structure for a bipolar junction transistor, the method comprising:
   forming a trench isolation region in a substrate, wherein the trench isolation region surrounds an active region of the substrate;
   forming a collector in the active region of the substrate;
   forming an extrinsic base layer positioned over the trench isolation region;
   forming a base layer including a first section positioned on the active region and a second section oriented at an angle relative to the first section; and
   forming an emitter positioned on the first section of the base layer,
   wherein the extrinsic base layer is positioned adjacent to the emitter, the second section of the base layer is laterally positioned between the extrinsic base layer and the emitter, and the base layer includes a third section positioned adjacent to the emitter and over the extrinsic base layer.

17. The method of claim 16, further comprising:
   forming a dielectric spacer laterally positioned between the second section of the base layer and the emitter.

18. The method of claim 16, further comprising:
   patterning an opening that penetrates through the extrinsic base layer to the first section of the base layer.

19. The method of claim 18, wherein the first section and the second section of the base layer are positioned inside the opening, and the emitter is positioned inside the opening with the second section of the base layer laterally between the emitter and the extrinsic base layer.

20. The method of claim 16 wherein, the third section of the base layer has a top surface, and the emitter has a top surface that is substantially coplanar with the top surface of the third section of the base layer.

* * * * *